(12) United States Patent
Goyal

(10) Patent No.: US 7,047,470 B2
(45) Date of Patent: May 16, 2006

(54) FLEXIBLE AND EXTENSIBLE IMPLEMENTATION OF SHARING TEST PINS IN ASIC

(75) Inventor: Saket K. Goyal, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 428 days.

(21) Appl. No.: 10/441,000

(22) Filed: May 19, 2003

(65) Prior Publication Data

US 2004/0210806 A1     Oct. 21, 2004

Related U.S. Application Data

(63) Continuation-in-part of application No. 10/417,007, filed on Apr. 16, 2003.

(51) Int. Cl.
*G06F 11/00* (2006.01)

(52) U.S. Cl. ......................... 714/742; 714/27

(58) Field of Classification Search .................. 716/11, 716/4; 714/734, 733, 724, 742, 27
See application file for complete search history.

(56) References Cited

U.S. PATENT DOCUMENTS

| | | | |
|---|---|---|---|
| 6,499,125 B1* | 12/2002 | Ohta et al. .................. 714/734 |
| 6,557,153 B1* | 4/2003 | Dahl et al. ..................... 716/11 |
| 6,564,363 B1* | 5/2003 | Dahl et al. ..................... 716/11 |
| 6,678,875 B1* | 1/2004 | Pajak et al. ................... 716/11 |
| 6,836,872 B1* | 12/2004 | Abdennadher ................. 716/4 |

* cited by examiner

*Primary Examiner*—David Ton
(74) *Attorney, Agent, or Firm*—Trexler, Bushnell, Giangiorgi, Blackstone & Marr, Ltd.

(57) ABSTRACT

A library to be used in an ASIC design system includes information to be used for verification of test structures. The library includes information regarding the ability to combine test pins for verification of the test structure and information regarding the sharing of ports for verification of the test structure. A user of the ASIC design system can include custom test structures in the library for verification.

16 Claims, 2 Drawing Sheets

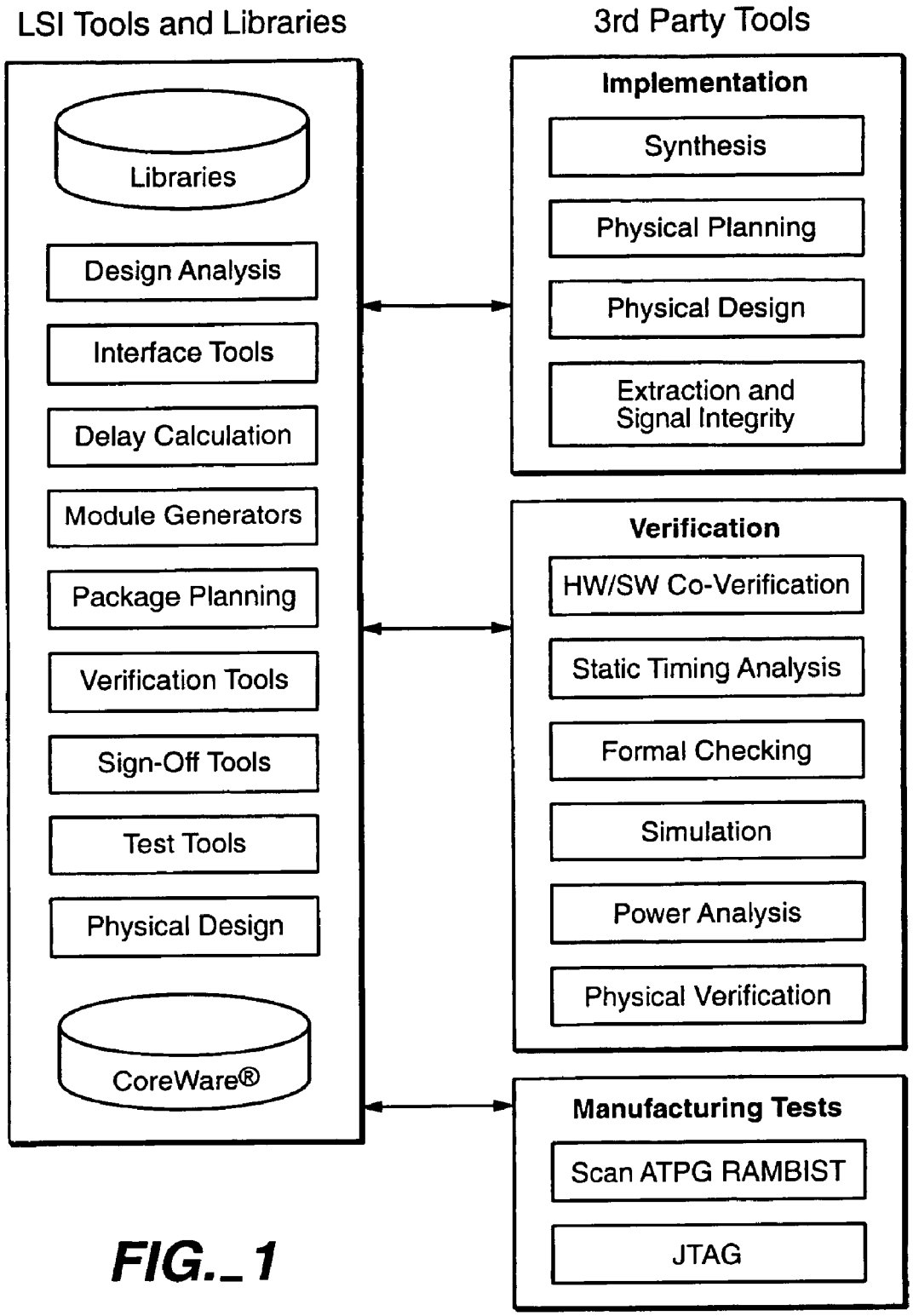
FIG._1

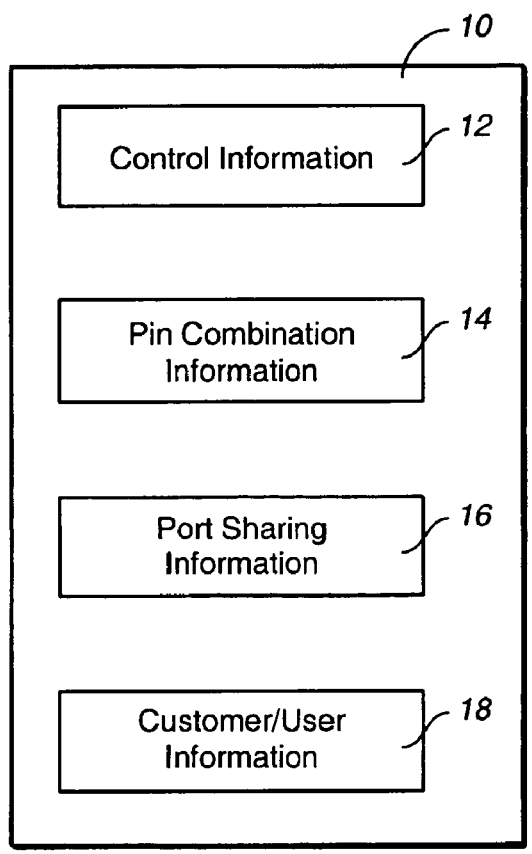
FIG._2
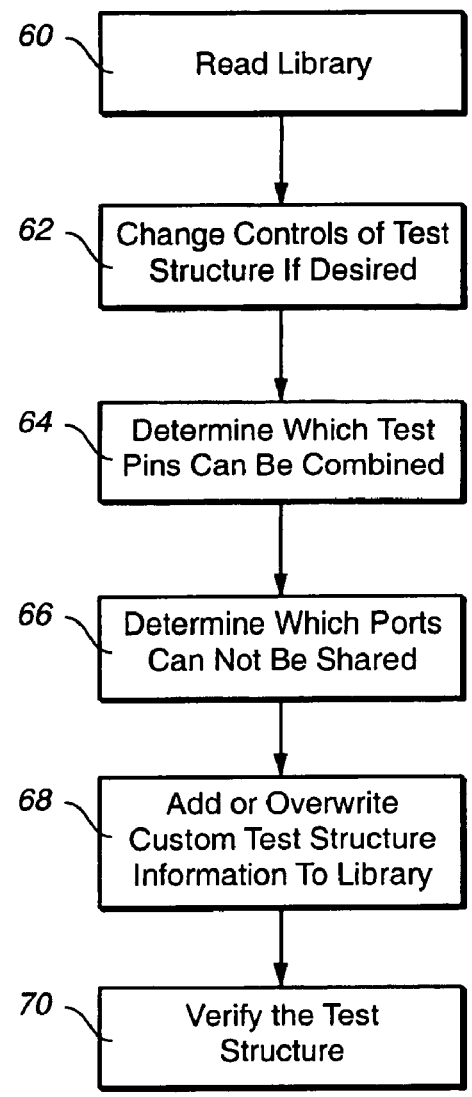
FIG._3

FLEXIBLE AND EXTENSIBLE IMPLEMENTATION OF SHARING TEST PINS IN ASIC

RELATED APPLICATION (PRIORITY CLAIM)

This application is a continuation-in-part of U.S. patent application Ser. No. 10/417,007, filed Apr. 16, 2003.

COPYRIGHT NOTICE

A portion of the disclosure of this patent application contains material which is subject to copyright protection. The copyright owner has no objection to the facsimile reproduction by anyone of the patent document of the patent disclosure, as it appears in the United States Patent and Trademark Office patent files or records, but otherwise reserves all copyrights whatsoever.

BACKGROUND OF THE INVENTION

The present invention relates generally to the design of application specific integrated circuits (ASIC). LSI Logic, the Assignee of the present invention, provides a design system called "FlexStream" (which is a registered trademark of LSI Logic (all rights reserved)). As shown in FIG. 1, the FlexStream® design system is configured such that an ASIC designer uses certain third party tools (i.e., implementation, verification and manufacturing test tools) to design an ASIC, and uses LSI Logic's Flex Stream® design system to analyze the design. The FlexStream® design system is a fully integrated environment for complex ASIC and System-on-Chip (SoC) design. It provides a complete system-to-silicon methodology that enables first-pass silicon success to meet tight time-to-market windows. The FlexStream® design system is an integration of best-in-class LSI Logic and third party EDA tools. This approach provides an ASIC designer with the flexibility to use their preferred tools. The ASIC designer designs with efficiency and confidence because LSI Logic's strong partnerships with EDA vendors assure that third party tools are well-integrated into the FlexStream® environment. In addition to design capabilities, the FlexStream® design system provides a link between all the design components—process technology, libraries, memories, CoreWare functions, advance packaging solutions, and manufacturing, test and assembly. While the FlexStream® design system which is currently available provides many advantages, it does not define a system or provide the necessary guidelines or information needed to effectively verify new test structures of an ASIC.

As design complexity increases, the testing requirements for those designs also increases. There are various kinds of tests which can be performed in an ASIC environment. There are also various kinds of test structures which can be introduced in a design. Each test structure has its own set of controls for testing. Each time a new test structure is introduced, a great amount of development and verification must occur before the test structure can be made available to the public. If the introduction of new test structures continues to grow at the current pace, the solutions for testing these test structures will become obsolete and virtually impossible to use.

Each test structure includes test pins (input and output) which need to be controlled or observed from the top level functional pins during manufacturing tests. Thus, the test pins and functional pins are shared. In order to accomplish sharing of the test pins and functional pins, certain structures, for example, boundary scan cells must be controlled. Another problem encountered is that with the growing number of test pins, a sufficient number of functional ports may not exist for sharing. Each test pin is associated with one or more control pin(s).

Currently, the test structures are designed through the use of software. However, using software to design the test structures requires a massive amount of development and is very error prone. Another problem encountered is that, if a designer creates his own test structures, it is almost impossible to verify the custom test structures along with standard test structures. In addition, it would be difficult to test whether the controls are operating properly, or if some of the controls need to be changed. Such testing of the controls would require communication between the development organization and users. Generally, the time needed for this communication is very lengthy and users do not receive the information they need in a timely fashion. Finally, to reduce the number of functional ports required for sharing, some test pins need to be combined for test purposes. With approximately 40 different types of test pins, implementing the combinations of test pins would be overwhelming.

Thus, adding new test structures to current designs is difficult. In addition, given the number of types of test pins, combining some test pins for functional test ports is extremely difficult. The current design methods also do not allow for the addition of custom test structures. Thus, introducing custom test structures to the ASIC design requires a significant amount of development time and verification time which may not be available. Finally, it the design does not operate as expected, and changes are needed, the changes can not be immediately implemented by the customer. Rather, the customer must request changes, the designer must implement the changes and then provide the customer with the changes which results in undesirable delays.

OBJECTS AND SUMMARY

An object of an embodiment of the present invention is to allow changes to the controls and definitions of the existing test structures.

Another object of an embodiment of the present invention to provide a library with information regarding which test pins can be combined for sharing with a functional port for testing.

Yet another object of an embodiment of the present invention is to provide the customer with information regarding the optimization of the number of functional ports for sharing test pins.

A further object of an embodiment of the present invention is to allow customized test structures to be easily introduced.

Still a further object of an embodiment of the present invention is to reduce the amount of time required to develop and verify an ASIC test structure.

Briefly, and in accordance with at least one of the foregoing objects, an embodiment of the present invention provides a library which can be used to verify test structures of an ASIC. The library allows changes to the controls of the test structures and provides information regarding which test pins can be combined for sharing with a functional port for verification. The library allows a user to modify the library by either adding library information or rewriting library information so as to create a custom test structure.

BRIEF DESCRIPTION OF THE DRAWINGS

The present invention and the advantages thereof will become more apparent upon consideration of the following detailed description when taken in conjunction with the accompanying drawings, wherein like reference numeral represent like elements and wherein:

FIG. 1 illustrates LSI Logic's FlexStream® design system and its association with third party tools;

FIG. 2 illustrates a library which is in accordance with an embodiment of the present invention; and FIG. 3 illustrates a method which is in accordance with an embodiment of the present invention.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

An embodiment of the present invention is illustrated in FIG. 2. As shown, the embodiment provides a library 10 which includes the different types of information. The library 10 includes control information 12. The control information relates to standard test structures. This information can be easily changed by the library's user. The library includes pin combination information 14 which specifies how different types and similar types of test pins can be combined. The library 10 also includes port sharing information 16 which specifies what kind of ports can not be shared for certain test pins and thus assists the user in optimizing the number of functional ports for sharing test pins. Finally, the library 10 includes customer/user information 18. The customer/user information 18 defines customer test structures added to the library by the user. Preferably, the library 10 is built into the software tool, such as, for example, LSIVEGA. Further, preferably the library is provided within a design system. For example, it may be provided as a library in LSI Logic's FlexStream® design system (see FIG. 1).

A method in accordance with an embodiment of the present invention is shown in FIG. 3 and includes the step 60 of reading the library 10 (illustrated in FIG. 2). The library 10 can then be used to determine the test structure controls and change the controls if desired as represented by step 62, FIG. 3. The library is then used to determine which test pins can be combined for sharing with a common functional port for verification of the test structure as represented by step 64 of FIG. 3. Next, the library is then used to determine which ports can be shared, as represented by step 66 of FIG. 3. If desired, the user can add a custom test structure to the library, as represented by step 68, FIG. 3. Finally, the test structure is verified as represented by step 70, FIG. 3.

The invention also provides the ability to easily change the controls and other definitions of the existing test structure in the test mode. In addition, the invention provides a flexible way to combine different types or similar types of test pins together for sharing with a common functional port for testing purposes. The manner in which different types and similar types of pins can be combined is easily specified and optimization of the number of functional ports for sharing test pins is also easily specified.

The invention provides the ability to easily add new structures for testing. Portions of the library (vega.init) can be overwritten or new data can be added to the library when the tool is being run at the customer's site. For each type of test pin, approximately 5–10 lines of text need to be written in the format of the vega.init file. An example of that format is listed below with some sample examples for custom test structures.

```
technology_token {
    cambist_buf_sel_pin              unknown "LSI_CAMBIST_BUF_SEL"
    cambist_clk_pin                  unknown "LSI_CAMBIST_CLK"
    cambist_monitor_sel_pin          unknown "LSI_CAMBIST_MONITOR_SEL"
    cambist_rst_pin                  unknown "LSI_CAMBIST_RST"
    cambist_sel_pin                  unknown "LSI_CAMBIST_SEL"
    cambist_test_seq_pin             unknown "LSI_CAMBIST_TEST_SEQ"
    cambist_done_pin                 unknown "LSI_CAMBIST_DONE"
    cambist_error_pin                unknown "LSI_CAMBIST_ERROR"
    cambist_monitor_pin              unknown "LSI_CAMBIST_MONITOR"
    cambist_test_done_pin            unknown "LSI_CAMBIST_TEST_DONE"
    cambist_en_pin                   unknown "LSI_CAMBIST_EN"
    cambist_en_net                   unknown "net_LSI_CAMBIST_EN"
    iogen_shared_pin_by_name         unknown { scan_clock scan_in scan_out scan_set
                                      scan_reset scan_setreset scan_setn
                                      scan_resetn scan_setresetn
                                      bz_clock bz_resetn
                                      pll_ref_clk pll_resetn pll_t0 pll_t1
                                      pll_lock pll_f0 pll_f1
                                      lbram_scan_clock lbram_scan_in
                                      lbram_scan_out
                                      mbisrc_flarescan_in mbisr_scan_in
                                      mbisr_scan_out mbist_cmp_stat
                                      test_cw_in mbistc_clock
                                      cambist_buf_sel cambist_clk
                                      cambist_monitor_sel cambist_rst
                                      cambist_sel cambist_test_seq
                                      cambist_done cambist_error
                                      cambist_monitor cambist_test_done }
```

-continued

| | |
|---|---|
| iogen_shared_types_pins | unknown { poweron_clk scan_clock bz_clock pll_ref_clk lbram_scan_clock mbistc_clock mbist_clock scan_set scan_reset scan_setreset scan_setn scan_resetn scan_setresetn bz_resetn pll_resetn cw_tap_tdi cw_tap_tck cw_tap_tms cw_tap_trstn pll_t0 pll_t1 pll_f0 pll_f1 pll_lock scan_in scan_out fuse_scan_in fuse_scan_out mbisr_scan_in mbisr_scan_out lbram_scan_in lbram_scan_out mbisrc_flarescan_in mbisr_flarescanout mbist_cmp_stat test_cw_in test_cw_out cambist_buf_sel cambist_clk cambist_monitor_sel cambist_rst cambist_sel cambist_test_seq cambist_done cambist_error cambist_monitor cambist_test_done } |
| cambist_buf_sel_dir | unknown "IN" |
| cambist_clk_dir | unknown "IN" |
| cambist_monitor_sel_dir | unknown "IN" |
| cambist_rst_dir | unknown "IN" |
| cambist_sel_dir | unknown "IN" |
| cambist_test_seq_dir | unknown "IN" |
| cambist_done_dir | unknown "OUT" |
| cambist_error_dir | unknown "OUT" |
| cambist_monitor_dir | unknown "OUT" |
| cambist_test_done_dir | unknown "OUT" |
| cambist_buf_sel_order | unknown "35" |
| cambist_clk_order | unknown "36" |
| cambist_monitor_sel_order | unknown "37" |
| cambist_rst_order | unknown "38" |
| cambist_sel_order | unknown "39" |
| cambist_test_seq_order | unknown "40" |
| cambist_done_order | unknown "41" |
| cambist_error_order | unknown "42" |
| cambist_monitor_order | unknown "43" |
| cambist_test_done_order | unknown "44" |
| cambist_buf_sel_direction | unknown { IN INOUT } |
| cambist_clk_direction | unknown { IN INOUT } |
| cambist_monitor_sel_direction | unknown { IN INOUT } |
| cambist_rst_direction | unknown { IN INOUT } |
| cambist_sel_direction | unknown { IN INOUT } |
| cambist_test_seq_direction | unknown { IN INOUT } |
| cambist_done_direction | unknown { OUT INOUT } |
| cambist_error_direction | unknown { OUT INOUT } |
| cambist_monitor_direction | unknown { OUT INOUT } |
| cambist_test_done_direction | unknown { OUT INOUT } |
| cambist_buf_sel_default_combine | gflxp { } |
| cambist_clk_default_combine | gflxp { } |
| cambist_monitor_sel_default_combine | gflxp { } |
| cambist_rst_default_combine | gflxp { } |
| cambist_sel_default_combine | gflxp { } |
| cambist_test_seq_default_combine | gflxp { } |
| cambist_done_default_combine | gflxp { } |
| cambist_error_default_combine | gflxp { } |
| cambist_monitor_default_combine | gflxp { } |
| cambist_test_done_default_combine | gflxp { } |
| cambist_buf_sel_combine | gflxp { } |
| cambist_clk_combine | gflxp { } |
| cambist_monitor_sel_combine | gflxp { } |
| cambist_rst_combine | gflxp { } |
| cambist_sel_combine | gflxp { } |
| cambist_test_seq_combine | gflxp { } |
| cambist_done_combine | gflxp { } |
| cambist_error_combine | gflxp { } |
| cambist_monitor_combine | gflxp { } |
| cambist_test_done_combine | gflxp { } |
| cambist_buf_sel_port_conflict | unknown { CLOCK ASYNC_SETN ASYNC_SET ASYNC_RESET ASYNC_RESETN } |
| cambist_clk_port_conflict | unknown { CLOCK ASYNC_SETN ASYNC_SET ASYNC_RESET ASYNC_RESETN } |
| cambist_monitor_sel_port_conflict | unknown { CLOCK ASYNC_SETN ASYNC_SET ASYNC_RESET ASYNC_RESETN } |
| cambist_rst_port_conflict | unknown { CLOCK ASYNC_SETN ASYNC_SET ASYNC_RESET ASYNC_RESETN } |

-continued

| | |
|---|---|
| cambist_sel_port_conflict | unknown { CLOCK ASYNC_SETN ASYNC_SET ASYNC_RESET ASYNC_RESETN } |
| cambist_test_seq_port_conflict | unknown { CLOCK ASYNC_SETN ASYNC_SET ASYNC_RESET ASYNC_RESETN } |
| cambist_done_port_conflict | unknown { CLOCK ASYNC_SETN ASYNC_SET ASYNC_RESET ASYNC_RESETN } |
| cambist_error_port_conflict | unknown { CLOCK ASYNC_SETN ASYNC_SET ASYNC_RESET ASYNC_RESETN } |
| cambist_monitor_port_conflict | unknown { CLOCK ASYNC_SETN ASYNC_SET ASYNC_RESET ASYNC_RESETN } |
| cambist_test_done_port_conflict | unknown { CLOCK ASYNC_SETN ASYNC_SET ASYNC_RESET ASYNC_RESETN } |
| cambist_buf_sel_testdef | unknown { } |
| cambist_clk_testdef | unknown { } |
| cambist_monitor_sel_testdef | unknown { } |
| cambist_rst_testdef | unknown { } |
| cambist_sel_testdef | unknown { } |
| cambist_test_seq_testdef | unknown { } |
| cambist_done_testdef | unknown { } |
| cambist_error_testdef | unknown { } |
| cambist_monitor_testdef | unknown { } |
| cambist_test_done_testdef | unknown { } |
| cambist_buf_sel_in_or_cntrl | unknown "cambist_en" |
| cambist_clk_in_or_cntrl | unknown "cambist_en" |
| cambist_monitor_sel_in_or_cntrl | unknown "cambist_en" |
| cambist_rst_in_or_cntrl | unknown "cambist_en" |
| cambist_sel_in_or_cntrl | unknown "cambist_en" |
| cambist_test_seq_in_or_cntrl | unknown "cambist_en" |
| cambist_done_in_or_cntrl | unknown "cambist_en" |
| cambist_error_in_or_cntrl | unknown "cambist_en" |
| cambist_monitor_in_or_cntrl | unknown "cambist_en" |
| cambist_test_done_in_or_cntrl | unknown "cambist_en" |
| cambist_buf_sel_out_or_cntrl | unknown "cambist_en" |
| cambist_clk_out_or_cntrl | unknown "" |
| cambist_monitor_sel_out_or_cntrl | unknown "cambist_en" |
| cambist_rst_out_or_cntrl | unknown "" |
| cambist_sel_out_or_cntrl | unknown "cambist_en" |
| cambist_test_seq_out_or_cntrl | unknown "cambist_en" |
| cambist_done_out_or_cntrl | unknown "cambist_en" |
| cambist_error_out_or_cntrl | unknown "cambist_en" |
| cambist_monitor_out_or_cntrl | unknown "cambist_en" |
| cambist_test_done_out_or_cntrl | unknown "cambist_en" |
| cambist_buf_sel_out_and_cntrl | unknown "cambist_en" |
| cambist_clk_out_and_cntrl | unknown "" |
| cambist_monitor_sel_out_and_cntrl | unknown "cambist_en" |
| cambist_rst_out_and_cntrl | unknown "" |
| cambist_sel_out_and_cntrl | unknown "cambist_en" |
| cambist_test_seq_out_and_cntrl | unknown "cambist_en" |
| cambist_done_out_and_cntrl | unknown "cambist_en" |
| cambist_error_out_and_cntrl | unknown "cambist_en" |
| cambist_monitor_out_and_cntrl | unknown "cambist_en" |
| cambist_test_done_out_and_cntrl | unknown "cambist_en" |
| cambist_buf_sel_input_enable_or_cntrl | unknown "1" |
| cambist_clk_input_enable_or_cntrl | unknown "" |
| cambist_monitor_sel_input_enable_or_cntrl | unknown "1" |
| cambist_rst_input_enable_or_cntrl | unknown "" |
| cambist_sel_input_enable_or_cntrl | unknown "1" |
| cambist_test_seq_input_enable_or_cntrl | unknown "1" |
| cambist_buf_sel_tn_and_gate_control | unknown "" |
| cambist_clk_tn_and_gate_control | unknown "cambist_en" |
| cambist_monitor_sel_tn_and_gate_control | unknown "" |
| cambist_rst_tn_and_gate_control | unknown "cambist_en" |
| cambist_sel_tn_and_gate_control | unknown "" |
| cambist_test_seq_tn_and_gate_control | unknown "" |
| cambist_buf_sel_fc_gain_mux_control | unknown "" |
| cambist_clk_fc_gain_mux_control | unknown "cambist_en" |
| cambist_monitor_sel_fc_gain_mux_control | unknown "" |
| cambist_rst_fc_gain_mux_control | unknown "cambist_en" |
| cambist_sel_fc_gain_mux_control | unknown "" |
| cambist_test_seq_fc_gain_mux_control | unknown "" |
| cambist_done_output_enable_or_cntrl | unknown "1" |
| cambist_error_output_enable_or_cntrl | unknown "1" |
| cambist_monitor_output_enable_or_cntrl | unknown "1" |
| cambist_test_done_output_enable_or_cntrl | unknown "1" |
| cambist_done_tn_or_gate_cntrl | unknown "cambist_en" |
| cambist_error_tn_or_gate_cntrl | unknown "cambist_en" |

| -continued | |
|---|---|
| cambist_monitor_tn_or_gate_cntrl | unknown "cambist_en" |
| cambist_test_done_tn_or_gate_cntrl | unknown "cambist_en" |
| } | |

Test structures come from a variety of organizations and implementation of the test structures can be accomplished in a matter of minutes. The new test structures can be tested without requesting changes in tools and therefore is easily accomplished by the various organizations simply by creating a custom library file, by adding lines of code in the library format, and running the existing tools within the test framework(FAST). Thus, the invention allows for the introduction of new test structures with out requiring months of development as typically required in previous methods. In the event custom test structures are added to the design, the amount of time spent in verification is shifted from development team to the customer.

ALTERNATIVE

Any new third party IP test structures can be easily implemented in existing test framework FAST)

While embodiments of the present invention are shown and described, it is envisioned that those skilled in the art may devise various modifications of the present invention without departing from the spirit and scope of the appended claims.

What is claimed is:

1. A library useable to facilitate verification of test structures of ar ASIC, said library comprising control information for a test structure, wherein said library contains data which identifies what types of ports cannot be shared for particular test pins during verification of said test structures.

2. A library as defined in claim 1, wherein said library is configured such that said control information is modifiable by a user.

3. A library as defined in claim 1, wherein said library contains data which identifies how test pins can be combined during verification of said test structures.

4. A library as defined in claim 1, wherein said library is configured such that custom test structures are addable to the library by a user of said library.

5. A method of verifying a test structure for an ASIC comprising the steps of:
   providing a library;
   using said library to verify the test structure; and
   determining which ports cannot be shared.

6. A method of verifying a test structure for an ASIC as defined in claim 5, further including the step of:
   changing the control of the test structure.

7. A method of verifying a test structure for an ASIC as defined in claim 5, further including the step of:
   determining which test pins can be combined.

8. A method of verifying a test structure for an ASIC as defined in claim 5, further including the step of:
   adding custom test structure information to the said library.

9. An ASIC design system comprising a library which is useable to facilitate verification of a test structure of an ASIC, said library comprising:
   information regarding the controls of the test structure, said controls being adaptable by said used; and
   information which specifies which ports can not be shared for verification of the test structure.

10. An ASIC design system as defined in claim 9, wherein said library of the system further comprises information which specifies which test pins can be combined for verification of the test structure.

11. An ASIC design system as defined in claim 9, wherein the library is configured such that custom test structures are addable to the library by a user of said ASIC design system.

12. A library useable to facilitate verification of test structures of an ASIC, said library comprising data which identifies what types of ports cannot be shared for particular test pins during verification of said test structures.

13. A library as defined in claim 12, said library comprising control information for a test structure.

14. A library as defined in claim 13, wherein said library is configured such that said control information is modifiable by a user.

15. A library as defined in claim 12, wherein said library contains data which identifies how test pins can be combined during verification of said test structures.

16. A library as defined in claim 12, wherein said library is configured such that custom test structures are addable to said library by a user of said library.

* * * * *